(12) United States Patent
Kiel

(10) Patent No.: US 10,998,831 B2
(45) Date of Patent: May 4, 2021

(54) POWER SWITCHING MODULE AND ELECTRONIC POWER DEVICE INTEGRATING SAID MODULE

(71) Applicant: INSTITUT VEDECOM, Versailles (FR)

(72) Inventor: Friedbald Kiel, Fontainebleau (FR)

(73) Assignee: INSTITUT VEDECOM, Versailles (FR)

( * ) Notice: Subject to any disclaimer, the term of this patent is extended or adjusted under 35 U.S.C. 154(b) by 0 days.

(21) Appl. No.: 16/971,614

(22) PCT Filed: Feb. 22, 2019

(86) PCT No.: PCT/FR2019/050413
§ 371 (c)(1),
(2) Date: Aug. 20, 2020

(87) PCT Pub. No.: WO2019/166722
PCT Pub. Date: Sep. 6, 2019

(65) Prior Publication Data
US 2020/0382015 A1    Dec. 3, 2020

(30) Foreign Application Priority Data

Feb. 27, 2018   (FR) ...................................... 1851690

(51) Int. Cl.
*H01L 23/051*   (2006.01)
*H02M 7/00*     (2006.01)
(Continued)

(52) U.S. Cl.
CPC .......... *H02M 7/003* (2013.01); *H01L 23/051* (2013.01); *H01L 24/90* (2013.01); *H01L 25/165* (2013.01);
(Continued)

(58) Field of Classification Search
CPC .... H02M 7/003; H01L 23/051; H01L 25/165; H01L 2023/4025; H01L 24/90; H05K 7/2049
See application file for complete search history.

(56) References Cited

U.S. PATENT DOCUMENTS 6,501,653 B1   12/2002   Landsgestell et al.
9,681,568 B1    6/2017   Wagoner et al.
(Continued)

FOREIGN PATENT DOCUMENTS

DE   11 2013 006 952 T5   12/2015
WO   WO-2018050713 A1 *    3/2018   ............ H01L 25/117

OTHER PUBLICATIONS

International Search Report for PCT/FR2019/050413 dated Jun. 25, 2019.
Written Opinion for PCT/FR2019/050413 dated Jun. 25, 2019.

*Primary Examiner* — Kyle J Moody
*Assistant Examiner* — Jye-June Lee
(74) *Attorney, Agent, or Firm* — Sandberg Phoenix & von Gontard, P.C.

(57) ABSTRACT

The power module comprises an electronic board (EB), in which at least one power switching branch is integrated, a capacitor ($C_E$) and at least three DC power supply busbars (B1, B2, B3), wherein the electronic board is mounted between a first busbar (B1) and a second busbar (B2) and the capacitor is mounted between the second busbar (B2) and a third busbar (B3) and the electronic board, the capacitor and the busbars comprise electric contact faces allowing assembly, of the "press pack" type, of the electronic board and of the capacitor.

12 Claims, 2 Drawing Sheets

(51) Int. Cl.
  *H01L 23/40* (2006.01)
  *H01L 25/16* (2006.01)
  *H05K 7/20* (2006.01)
  *H01L 23/00* (2006.01)

(52) U.S. Cl.
  CPC .... *H01L 2023/4025* (2013.01); *H05K 7/2049* (2013.01)

(56) References Cited

U.S. PATENT DOCUMENTS

2011/0256749 A1* 10/2011 Bayerer ............... H01R 12/585
  439/345
2017/0079132 A1* 3/2017 Bayerer ................ H02M 7/003
2020/0403523 A1* 12/2020 Kiel ...................... H02M 7/003

\* cited by examiner

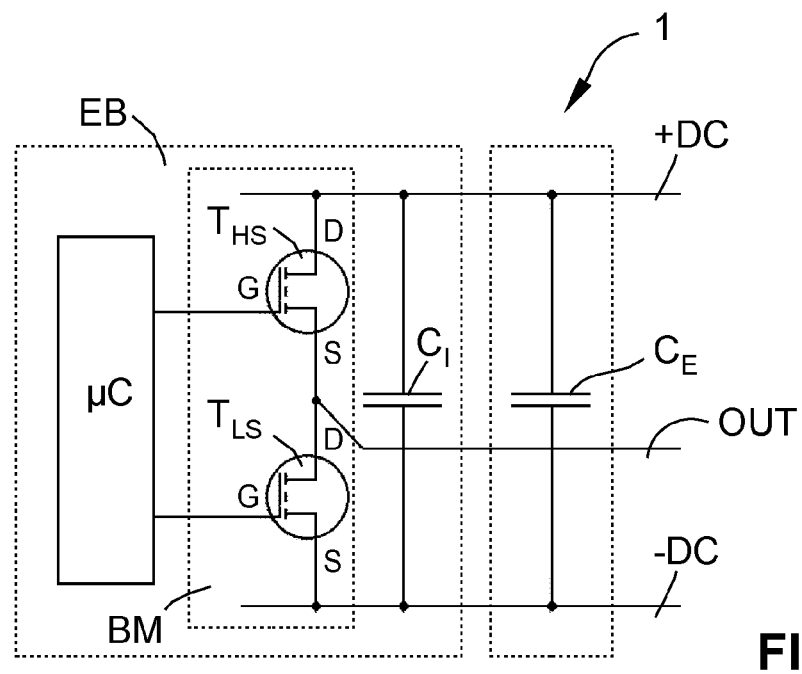
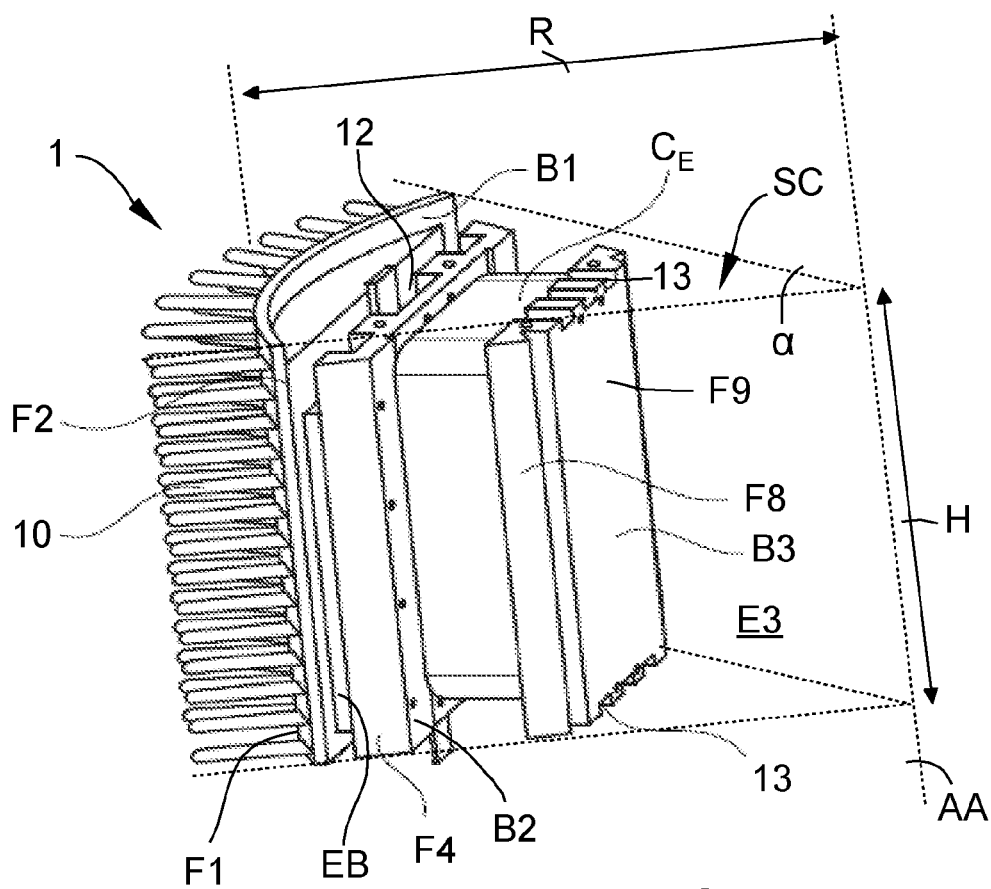

POWER SWITCHING MODULE AND ELECTRONIC POWER DEVICE INTEGRATING SAID MODULE

CROSS-REFERENCE TO RELATED APPLICATIONS

This application is the US National Stage under 35 USC § 371 of International Application No. PCT/FR2019/050413, filed 22 Feb. 2019, and which claims priority to French application 1851690 filed on 27 Feb. 2018, the content (text, drawings, and claims) of both being incorporated herein by reference.

BACKGROUND

The invention relates in a general manner to the field of power electronics. More particularly, the invention relates to power switching modules and electronic power devices integrating such modules.

Electronic power devices, such as invertors or power converters, but not exclusively, are present in a number of fields of activity, such as transport, industry, lighting, heating, etc. As a result of the desired energy transition toward renewable energy sources that produce fewer $CO_2$ emissions, power electronics are destined to become even more generalized and must comply with increasing economic and technological constraints. The current research and development in the field of electronic power devices focuses in particular on reducing costs, increasing the power density for greater compactness, increasing the reliability, reducing parasitic elements and electromagnetic radiation, and thermal transfer of the dissipated energy.

The various restrictions applicable to electronic power devices have led to a modular architecture of switching bridges, comprising elementary power switching modules, referred to as "power modules," which each correspond to one switching branch of the bridge. Thus, for example, a six-phase or tri-phase switching bridge, or a bridge comprising any number of phases or poles, can be obtained by assembling a plurality of power modules.

3D architectures are proposed for the power modules, having double-face cooling of power chips, and are of some interest with regard to increasing the compactness of electronic power devices. Seeking increased compactness requires the ability of maintaining the temperatures of the active and passive components below critical values, in order to achieve a thermal equilibrium and ensure reliability. Extraction of the dissipated energy as close as possible to the components is desirable. The thermal path between the heat sources formed of components and the heat sinks formed of heat dissipation means must be optimized. High-performance cooling devices are therefore essential.

The availability of new power semi-conductors, such as, silicon carbide (SiC) and gallium nitride (GaN) today, and soon, diamond, and a judicious use thereof, moves toward an increase in the compactness of power modules. These new power semi-conductors allow for higher current densities, higher switching frequencies, and higher voltages that favor the reduction in joule losses. However, solutions have to be found, since higher voltages increase the risk of breakdown, and are in opposition to a reduction in the distances between the components at different electrical potentials.

The reduction in the resistive, inductive and capacitive parasitic elements is essential in order to achieve the best possible compromise between seeking compactness and complying with the various design constraints. The parasitic inductances in the power busbars is in opposition to increased switching frequencies. Increased switching frequencies favor compactness but increase the switching losses and the power dissipated by the components. It is necessary to reduce the parasitic inductances in order to protect the circuits from possibly destructive overvoltages, improve the control of the electromagnetic radiation, reduce the heat generated, and increase the switching speed.

In order to improve the reliability, in particular in the applications in which there are severe thermal cycles, so-called "press-pack" technology is used. In "press-pack" technology, the electrical contacts are ensured by way of mechanical pressure or clamping means which keep the components in place and in contact. The "press-pack" technology makes it possible to make the power modules themselves modular, and the sub-modules thereof testable and replaceable. This results in more standardization and a reduction in production costs. Moreover, the "press-pack" technology is also of interest for facilitating the repair of the devices due to the fact that they can be dismantled.

The electronic power devices that have an outer geometric shape in the form of a disc or cylindrical wafer are of particular interest. This external geometric shape in the form of a cylindrical wafer in particular facilitates the integration of an electronic power converter at the rear of a rotating electrical machine, in the extension of the cylindrical stator thereof. The power modules of the converter must therefore be contained geometrically in adjacent cylindrical sectors. Implanting the filter capacitor of the DC current supply buses of the converter at the rear of a rotating electrical machine usually poses problems due to the large size of a capacitor of this kind. In the prior art, it is known to form said filter capacitor so as to have a plurality of cylindrical capacitors mounted in parallel, so as to facilitate the integration at the rear of the rotating electrical machine.

SUMMARY

It appears to be desirable, today, to propose a power module having a novel architecture, which facilitates the manufacture of an electronic power device having greater compactness and an external shape in the form of a cylindrical wafer, allowing for a better compromise in complying with the above-mentioned design constraints, and which are suitable for the new SiC and GaN power semi-conductors, as well as the 3D and "press-pack" technologies.

According to a first aspect, a power module is proposed comprising an electronic board in which at least one power switching branch, a capacitor, and at least three DC supply busbars are integrated, wherein the electronic board is mounted between a first busbar and a second busbar, and the capacitor is mounted between the second busbar and a third busbar, and the electronic board, the capacitor and the busbars comprise electrical contact faces allowing for "press-pack" type mounting of the electronic board and the capacitor.

According to a particular feature, the power module has an external shape that is contained in a cylindrical sector having a specified angle, and the electrical contact faces are substantially perpendicularly to a radial symmetry plane of the cylindrical sector.

According to a particular feature, the capacitor is of the multilayer ceramic type.

According to yet another particular feature, the electronic board is of the so-called "SiP" type and comprises control means and at least one first level capacitive filter capacitor.

According to yet another particular feature, the first level capacitive filter capacitor is a capacitor is of the multilayer ceramic type.

According to yet another particular feature, the first busbar comprises an outside face in the shape of a circular arc, comprising a plurality of cooling fins.

According to yet another particular feature, at least the first busbar of the three busbars comprises two junction faces that are inclined symmetrically with respect to a radial plane of symmetry.

According to yet another particular feature, at least one channel for passage and/or filling of a liquid having a heat-transport and/or fire-proofing and/or electrical insulation function is included in at least one of the three busbars.

According to yet another particular feature, at least one power switching branch comprises at least one transistor of the GaN, SiC, MOSFET or IGBT type.

According to yet another particular feature, the three DC supply busbars are made of copper and/or aluminum.

According to another aspect, an electronic power device is disclosed comprising a plurality of power modules as described briefly above, the power modules being arranged in a circle and being in electrical contact by means of the first, second and third busbars thereof.

According to a particular feature, the electronic power device comprises a central volume that is occupied by an electrical, mechanical and/or electronic liquid and/or element, the liquid having a heat-transport and/or fire-proofing and/or electrical insulation function.

DESCRIPTION OF THE FIGURES

Other advantages and features of the present invention will emerge more clearly upon reading the detailed description, below, of a particular embodiment of the invention, with reference to the accompanying drawings, in which:

FIG. 1 is a wiring flow diagram of a particular embodiment of a power module;

FIG. 2 is an outside perspective view of a power module;

DETAILED DESCRIPTION

Figure 3:
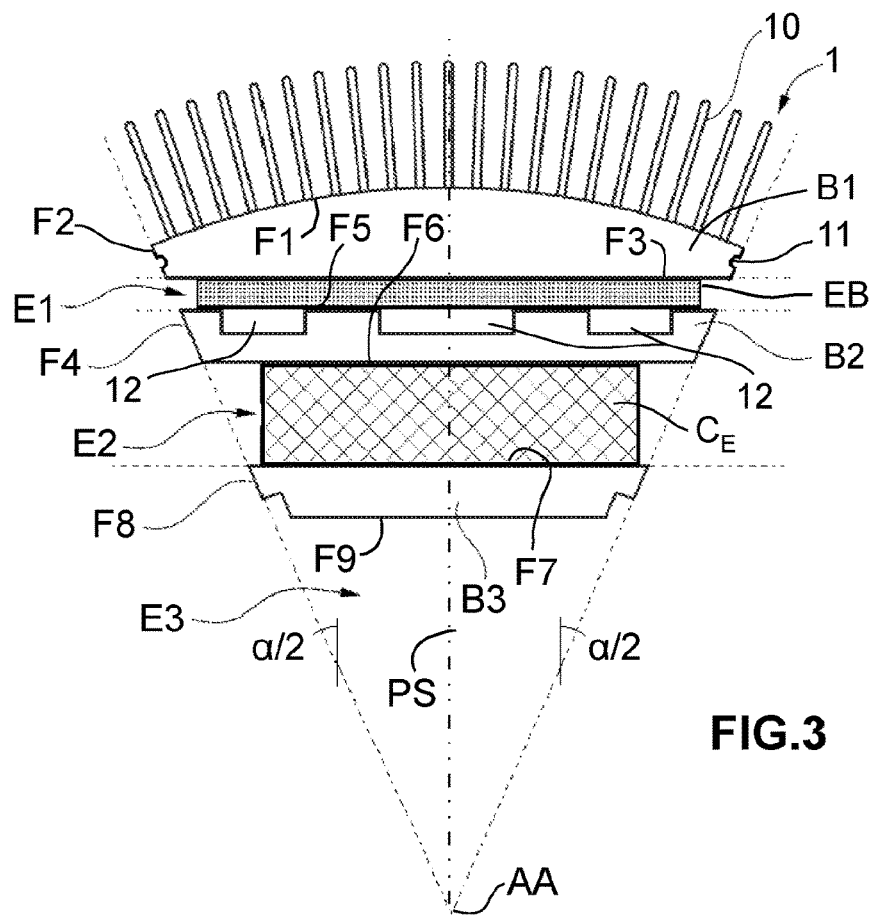
FIG. 3 is a cross-sectional view of a power module.

FIG. 1 is an electrical diagram of a particular embodiment 1 of a power module according to the invention. The power module 1 is of the SiP ("System in Package") type and comprises a switching bridge branch BM with which a controller μC and capacitive filter means $C_I$ and $C_E$.

In this case, the switching bridge branch BM comprises two transistors $T_{HS}$ and $T_{LS}$ of the gallium nitride (GaN) type. Of course, other types of electronic power switches can be used, such as MOSFET or IGBT transistors. The transistors $T_{HS}$ and $T_{LS}$ form high and low parts, referred to as the "high side" and "low side," and are connected between DC supply buses at positive +DC and negative −DC voltages, respectively. As can be seen in FIG. 1, the drain electrode D and source electrode S of the transistors $T_{HS}$ and $T_{LS}$ are connected to the +DC and −DC buses, respectively. The source electrode S and drain electrode D of the transistors $T_{HS}$ and $T_{LS}$, respectively, are interconnected and form the switched power output OUT of the power module 1.

The controller μC controls the switching of the transistors $T_{HS}$ and $T_{LS}$ via the gate electrodes G thereof, and can fulfil other functions which depend on the applications, such as detecting a breakdown.

The capacitive filtering means comprises a first capacitor $C_I$ and a second capacitor $C_E$ which are connected between the +DC and −DC buses. The capacitors form, respectively, a first level capacitive filter means and a second level capacitive filter means.

The switching bridge branch BM, the controller μC and the capacitor $C_I$ are included in the same electronic board EB of the SiP type.

The capacitor $C_I$ is typically of the multilayer ceramic type and can be formed from just one capacitor or a plurality of capacitors in parallel. By being implanted in the electronic board EB, the capacitor $C_I$, as the first level capacitive filter means, is located closer to the transistor chips.

Advantageously, the electronic board EB can be formed using proven and economical techniques for manufacturing electronic boards having a printed circuit, and have a 3D architecture.

The capacitor $C_E$, as the second level capacitive filter means, has a much greater capacity than the capacitor $C_I$, and thus ensures more significant capacitive filtering. The capacitor $C_E$ is a large-volume component and is implanted on the outside of the electronic board EB. The capacitor $C_E$ is typically of the multilayer ceramic type.

The material architecture of the power module 1, having the arrangement of the electronic board EB and of the capacitor $C_E$ between the busbars, will now be described in detail below, with reference to FIGS. 2 to 4.

As can be seen in FIG. 2, which is an outside perspective view, the power module 1 is contained in a cylindrical sector SC. The cylindrical sector SC is defined by a sector axis AA, a radius R, a sector angle α and a height H. In this particular embodiment, the sector SC is of an angle equal to 60°.

This external configuration contained in a cylindrical sector makes it possible to form an electronic power device in the form of a cylindrical wafer, by arranging a plurality of power modules so as to be adjacent each other. As shown in FIG. 4, in this case a six-phase electronic power device CONV can be obtained by assembling six analogous power modules 1-6.

With reference more particularly to FIGS. 2 and 3, the power module 1 substantially comprises the electronic board EB, the capacitor $C_E$, and three busbars B1, B2 and B3. The electronic board EB and the capacitor $C_E$ are contained in internal volumes E1 and E2 provided between the busbars B1, B2 and B2, B3, respectively.

In the power module 1, the busbars B1 and B3 are intended to be brought to the continuous negative voltage −DC, which corresponds to the mass polarity. The busbar B2 is intended to be brought to the continuous positive voltage +DC.

The busbars B1, B2 and B3 are formed of metal conductors such as aluminum or copper, and can be manufactured by molding and/or machining and/or cutting a profile bar into sections.

The busbar B1 comprises a plurality of cooling fins 10 which are formed on an external lateral face F1 in the shape of a circular arc. The cooling fins 10 extend radially toward the outside, from the external lateral face in the shape of a circular arc F1. The busbar B1 thus forms a heat sink. Furthermore, the busbar B1 in particular comprises two inclined junction faces F2 which are substantially planar, and a substantially planar internal face F3.

The two junction faces F2 form opposing longitudinal ends of the busbar B1 and are inclined by an angle of α/2 with respect to a radial plane of symmetry PS of the cylindrical sector SC. In this embodiment, having the power module 1 contained in a cylindrical sector of angle α=60°, the two junction faces F2 are inclined by an angle α/2=30°.

The junction faces F2 of the busbar B1 are intended to come into contact with the corresponding junction faces F2 of adjacent power modules. It will be noted that the term "planar" used here to qualify the junction faces F2 need not be interpreted strictly. Indeed, as is shown in FIG. 3, said junction faces F2 can, for example, comprise grooves 11 for accommodating seals, such as of the "Viton®" type. Removable mechanical connection means (not shown) can also be arranged in the region of said junction faces F2.

The internal face F3, which is substantially planar, is a face that is in contact with the electronic board EB by means of clamping. In the same way as indicated above for the junction face F2, the term "planar" used here to qualify the internal face F3 need not be interpreted strictly, given that various arrangements can be provided, depending on the applications.

The busbar B2 in particular comprises two junction faces F4 that form opposing longitudinal ends of the busbar B2, and the first and second faces F5 and F6.

In a manner analogous to the faces F2 of the busbar B1, the two junction faces F4 are inclined by the angle α/2 with respect to the radial plane of symmetry PS of the cylindrical sector SC. The junction faces F4 are intended to come into contact with the corresponding junction faces F4 of adjacent power modules.

The first face F5 of the busbar B2 is a face that is in contact with the electronic board EB by means of clamping. As can be seen in FIGS. 2 and 3, channels 12 are arranged in said first face F5 and are typically intended for circulation, or filling, of a liquid having a heat-transport and/or fire-proofing and/or electrical insulation function. Of course, in other embodiments the channels of liquid can also, or exclusively, be formed in the internal face F3 of the busbar B1. It will be noted that the fire-proofing and electrical insulation functions make it possible to prevent electrical breakdowns or fires starting, and subsequent possible degradation of the power module.

The faces F3 and F5 are suitable for "press-pack" mounting of the electronic board EB between the busbars B1 and B2. The internal volume E1 arranged between the faces F3 and F5 is sized to receive the electronic board EB.

The second face F6 of the busbar B2 is a substantially planar face that is oriented opposite a first, substantially planar, face F7 of the busbar B3. The faces F6 and F7 are substantially parallel and define the second internal volume E2 in which the capacitor $C_E$ is contained. The faces F6 and F7 are faces that are in contact, by means of clamping, with the first and second substantially planar electrodes of the capacitor $C_E$, and are suitable for "press-pack" mounting of the capacitor $C_E$ between the busbars B2 and B3.

In addition to the first face F7, the busbar B3, in particular, comprises two junction faces F8 that form opposing longitudinal ends of the busbar, and a second face F9. In a manner analogous to the junction faces F2 of the busbar B1, the two junction faces F8 are inclined by the angle α/2 with respect to the radial plane of symmetry PS of the cylindrical sector SC. The junction faces F8 are intended to come into contact with the corresponding junction faces F8 of adjacent power modules.

All the faces F3, F5, F6 and F7 of the busbars B1, B2 and B3 are electrical contact faces which are substantially perpendicular to the radial plane of symmetry PS of said cylindrical sector SC, and allow for "press-pack" mounting of the electronic board EB and of the capacitor $C_E$ between the busbars.

The second face F9 of the busbar B3 is substantially planar and in parallel with the first face F7, and forms an end face of the power module 1 that is perpendicular to the radial plane of symmetry PS of the cylindrical sector SC. A volume E3 is available in the cylindrical sector SC, between the sector axis AA and the face F9.

Channels 13, visible in FIG. 2, are provided on the top and bottom end faces of the busbar B3. The channels 13 are intended in particular for the passage, or filling, of heat-transport and/or fire-proofing and/or electrically insulating liquid.

The "press-pack" assembly of the power module 1 makes use, for example, of resilient fasteners which ensure the required clamping, or screws mounted through insulated screw passages in order to prevent short circuits. These mechanical assembly techniques by means of clamping are well known to those skilled in the art, and are not described in detail here.

Figure 4:
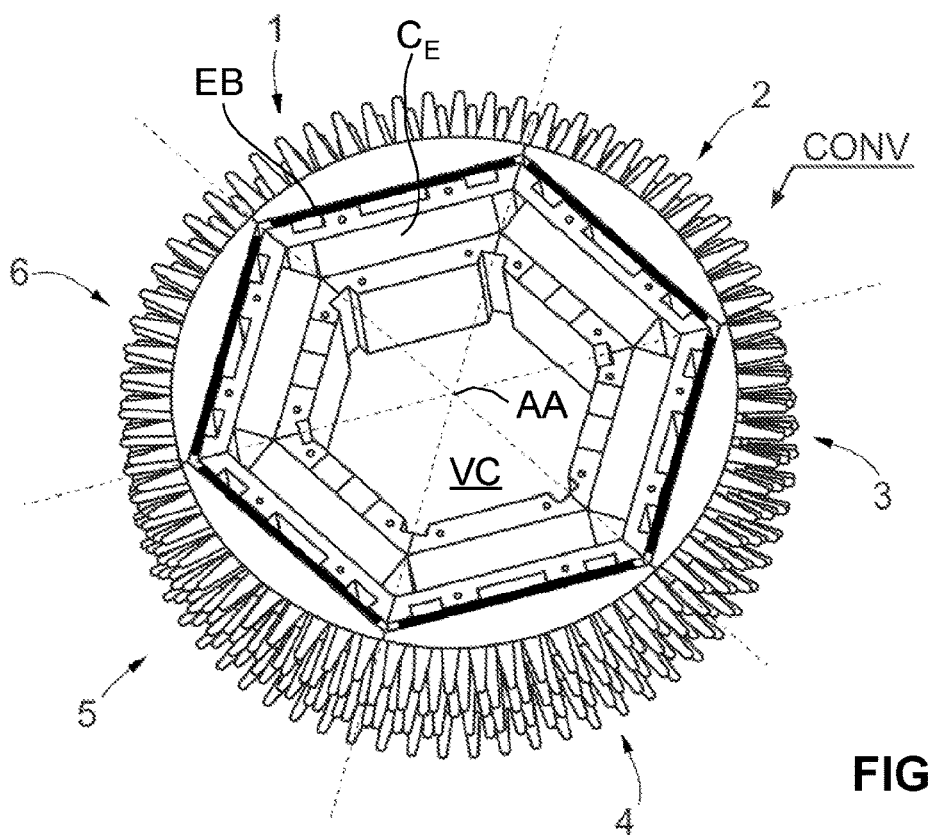
FIG. 4 is an outside perspective view of a particular embodiment of an electronic power device comprising a plurality of power modules.

As is clear in FIG. 4, when a plurality of power modules, 1 to 6 in this example, are assembled to form an electronic power device CONV in the form of a cylindrical wafer, a central volume VC remains available by means of the addition of various volumes E3 that remain free.

According to the electronic power devices produced using a plurality of power modules, the central volume VC can be dedicated to various functions. Thus, for example, the central volume VC can be dedicated, in part or completely, to circulation or filling of a liquid having a heat-transport and/or fire-proofing and/or electrical insulation function. In another use, the central volume VC can be dedicated, in part or completely, to accommodating additional capacitive filter means and/or energy storage means, for example in the form of a lithium ion-type battery, a supercapacitor or any other mechanical, electrical and/or electronic element.

The top and bottom faces of the electronic power device CONV are closed by means of plates brought to the voltage −DC of the busbars B1 and B3. A Faraday cage is thus obtained, and provides electromagnetic armor that is conducive to the electromagnetic compatibility (EMC). The sealing in the region of the top and bottom faces can be ensured by seals, for example of the "Viton"® type.

It will be noted here that the circular wafer shape of the electronic power device CONV makes said device perfectly suitable for integration in a rotating electrical machine, for example a traction engine or a reversible machine associated with a regenerative braking system.

The invention is not limited to the particular embodiment that has been described here by way of example. Depending on the applications of the invention, one skilled in the art could make various amendments and variants which are within the scope of the attached claims.

The invention claimed is:

1. A power module comprising an electronic board in which at least one power switching branch, a capacitor, and at least a first DC supply busbar a second DC supply busbar, and a third DC supply busbar are integrated, wherein said electronic board is mounted between said first busbar and said second busbar, and said capacitor is mounted between said second busbar and said third busbar, and said electronic board, capacitor and busbars comprise electrical contact faces allowing for "press-pack" type mounting of the electronic board and the capacitor.

2. The power module according to claim 1, wherein said power module has an external shape that is contained in a cylindrical sector having a specified angle, and said electrical contact faces are substantially perpendicular to a radial symmetry plane of the cylindrical sector.

3. The power module according to claim 1, wherein said capacitor is of the multilayer ceramic type.

4. The power module according to claim 1, wherein said electronic board is of a "SiP" (System in Package) type and comprises a controller and at least one first level capacitive filter capacitor.

5. The power module according to claim 4, wherein said first level capacitive filter capacitor is a capacitor of a multilayer ceramic type.

6. The power module according to claim 1, wherein said first busbar comprises an outside face in a shape of a circular arc, comprising a plurality of cooling fins.

7. The power module according to claim 2, wherein at least said first busbar comprises two junction faces that are inclined symmetrically with respect to said radial symmetry plane.

8. The power module according to claim 1, wherein at least one channel for passage or filling of a liquid having a heat-transport, fire-proofing, or electrical insulation function is included in at least one of said first, second, and third busbars.

9. The power module according to claim 1, wherein said at least one power switching branch comprises at least one transistor of a GaN, SiC, MOSFET or IGBT type.

10. The power module according to claim 1, wherein said first, second, and third DC supply busbars are made of copper, aluminum, or copper and aluminum.

11. An electronic power device comprising a plurality of power modules according claim 1, said power modules being arranged in a circle and being in electrical contact by means of said first, second and third busbars thereof.

12. The electronic power device according to claim 11, wherein said electronic power device comprises a central volume that is occupied by an electrical element, a mechanical element, an electronic element, or a liquid, wherein said liquid having a heat-transport, fire-proofing, or electrical insulation function.

* * * * *